(12) United States Patent
Tasaki et al.

(10) Patent No.: US 9,018,663 B2
(45) Date of Patent: Apr. 28, 2015

(54) LENS-EQUIPPED OPTICAL SEMICONDUCTOR DEVICE AND METHOD FOR MANUFACTURING THE SAME

(75) Inventors: Masutsugu Tasaki, Saitama (JP); Akira Ichikawa, Saitama (JP); Hideaki Sato, Saitama (JP); Satoshi Endo, Saitama (JP); Takayuki Motoyanagi, Saitama (JP); Yoshihiro Okabe, Saitama (JP); Yoichi Orikasa, Saitama (JP); Masaru Azuma, Saitama (JP)

(73) Assignee: Asahi Rubber Inc. (JP)

( * ) Notice: Subject to any disclaimer, the term of this patent is extended or adjusted under 35 U.S.C. 154(b) by 0 days.

(21) Appl. No.: 14/110,816

(22) PCT Filed: Apr. 25, 2012

(86) PCT No.: PCT/JP2012/002828
§ 371 (c)(1),
(2), (4) Date: Oct. 9, 2013

(87) PCT Pub. No.: WO2012/147342
PCT Pub. Date: Nov. 1, 2012

(65) Prior Publication Data
US 2014/0027807 A1 Jan. 30, 2014

(30) Foreign Application Priority Data
Apr. 28, 2011 (JP) .................. 2011-102417

(51) Int. Cl.
*H01L 33/00* (2010.01)
*H01L 33/52* (2010.01)
(Continued)

(52) U.S. Cl.
CPC ................ *H01L 33/52* (2013.01); *H01L 33/58* (2013.01); *H01L 2933/005* (2013.01);
(Continued)

(58) Field of Classification Search
CPC ............... H01L 3/08; H01L 3/18; H01L 3/20; H01L 3/26; H01L 3/38; H01L 3/42; H01L 3/465; H01L 3/486; H01L 3/52; H01L 3/54; H01L 3/58; H01L 3/56; H01L 3/60
USPC ....................................... 257/92–100
See application file for complete search history.

(56) References Cited

U.S. PATENT DOCUMENTS

| 7,800,124 | B2 * | 9/2010 | Urano et al. .............. 257/98 |
| 2007/0205425 | A1 | 9/2007 | Harada |

(Continued)

FOREIGN PATENT DOCUMENTS

| EP | 1455398 | 8/2004 |
| EP | 1885003 | 6/2008 |

(Continued)

OTHER PUBLICATIONS

Korean Office Action—Aug. 22, 2014.
(Continued)

*Primary Examiner* — Brook Kebede
(74) *Attorney, Agent, or Firm* — Gerald E. Hespos; Michael J. Porco; Matthew T. Hespos

(57) ABSTRACT

A lens-equipped optical semiconductor device including: an optical semiconductor device including at least one optical semiconductor element mounted on a substrate and a transparent resin encapsulating body that encapsulates the optical semiconductor element; a resin lens having a recessed portion for housing the transparent resin encapsulating body; and a transparent resin layer filled into a space among the substrate, the recessed portion, and the transparent resin encapsulating body, wherein the recessed portion has a capacity that is at least 1.1 times a total volume of the optical semiconductor element and the transparent resin encapsulating body.

12 Claims, 16 Drawing Sheets

(51) Int. Cl.
*H01L 33/58* (2010.01)
*H01L 23/00* (2006.01)

(52) U.S. Cl.
CPC ........ *H01L 2924/0002* (2013.01); *H01L 24/97* (2013.01); *H01L 2224/48091* (2013.01); *H01L 2224/45144* (2013.01); *H01L 2924/12041* (2013.01)

(56) References Cited

U.S. PATENT DOCUMENTS

2008/0048200 A1  2/2008  Mueller et al.
2011/0193118 A1* 8/2011  Oshima et al. .................. 257/98

FOREIGN PATENT DOCUMENTS

| EP | 2214046 | 4/2010 |
|----|---------|--------|
| JP | 2002-221658 | 8/2002 |
| JP | 2003-8065 | 1/2003 |
| JP | 2007-73825 | 3/2007 |
| JP | 2009-537991 | 10/2009 |
| JP | 2010-519757 | 6/2010 |
| WO | 2007-136956 | 11/2007 |

OTHER PUBLICATIONS

Extended European Search Report—Sep. 16, 2014.
International Search Report of Jul. 17, 2012.

* cited by examiner

LENS-EQUIPPED OPTICAL SEMICONDUCTOR DEVICE AND METHOD FOR MANUFACTURING THE SAME

BACKGROUND

1. Field of the Invention

The present invention relates to an optical semiconductor device including a resin lens. More particularly, the invention relates to a technique for improving the light distribution accuracy of an optical semiconductor device including a resin lens.

2. Description of the Related Art

The applications of LED devices using light-emitting diodes (LEDs) have been expanding in recent years. Specifically, such LED devices are used, for example, for general indoor light fittings, spotlights such as courtesy lights, backlights of flat-screen televisions and information terminal devices, car taillights, street lights, traffic lights, and so forth.

A general LED device includes a transparent resin encapsulating body for protecting a LED element (also referred to as a LED chip) mounted on a submount substrate. As shown in FIG. 19, a hemispherically molded transparent resin encapsulating body 3 for encapsulating an LED element 1 mounted on a submount substrate 2 is known (e.g., Laid-Open Patent Publication No. JP2010-519757). Molding the transparent resin encapsulating body in the shape of a hemispherical lens in this way improves the efficiency of extracting the emission of the LED element to the outside and enables the light distribution pattern to be controlled in the LED device. For example, in the case of an LED device 110 in FIG. 19, an electrode 1a provided on the bottom face of the LED element 1 is die-bonded to a circuit electrode 2a formed on the submount substrate 2, and an electrode 1b provided on the upper face of the LED element 1 is wire-bonded to a circuit electrode 2b using a gold wire w. Thus, the LED element 1 is mounted on the submount substrate 2. Then, the mounted LED element 1 is encapsulated with the hemispherically molded transparent resin encapsulating body 3. The LED device 110 is mounted onto a printed-circuit board via electrode terminals 1c and 1d provided on the submount substrate 2 for establishing an electrical connection to the outside.

A general method for producing this LED device will now be described with reference to FIGS. 20 to 21.

FIGS. 20 are schematic cross-sectional views illustrating processes of overmolding a hemispherical transparent resin encapsulating body 3 so as to cover each of a plurality of LED elements 1 mounted on an aggregate base substrate 12. First, as shown in FIG. 20(a), the aggregate base substrate 12 on which the LED elements 1 are mounted is fixed to an upper mold 21a of an overmolding mold 21. Further, an uncured liquid resin 105' is injected into a plurality of lens-shaped cavities provided on a lower mold 21b of the mold 21 using a dispenser D. For example, 100 or more LED elements 1 may be mounted onto a single aggregate base substrate 12 in a mass-production process.

Then, as shown in FIG. 20(b), the mold 21 is closed and then heated, thus curing the liquid resin 105'. Then, as shown in FIG. 20(c), the mold 21 is opened. Then, as shown in FIG. 20(d), the aggregate base substrate 12 is removed from the upper mold 21a, thus obtaining a large number of LED devices 110 formed on the aggregate base substrate 12 and each including the hemispherical transparent resin encapsulating body 3.

Next, a description will be given of a process of cutting the aggregate base substrate 12 including the thus obtained large number of LED devices 110 using a dicing saw S so as to separate the LED devices 110. FIG. 21 is a schematic illustration of the aforementioned process. In this process, as shown in FIG. 21, the aggregate base substrate 12 is cut along a preset grid-like cut line L using a dicing saw S, thus separating the LED devices 110. Thus, the LED devices 110 each including the hemispherical transparent resin encapsulating body 3 serving as a lens are mass-produced by multi-cavity molding.

However, the LED device production method including the overmolding process as described above has a problem in that the arrangement position of the transparent resin encapsulating body is offset with respect to the position of the center of the LED elements. This problem will be described in detail with reference to FIG. 22.

The cut line L is formed in the aggregate base substrate 12 in advance. The submount substrates 2 are separated by cutting the aggregate base substrate 12 along the cut line L. The LED elements 1 are disposed accurately at predetermined positions of the respective submount substrates 2. Specifically, for example, each of the LED elements 1 is designed such that the LED element 1 and the transparent resin encapsulating body 3 covering that LED element 1 are positioned accurately at the center of a square surrounded by the cut line L. In such a design, the transparent resin encapsulating body 3 needs to be molded such that its center is aligned with the center of the LED element 1. However, due to the influence of the coefficient of linear expansion of the aggregate base substrate during overmolding, the transparent resin encapsulating body 3 may be molded offset from the designed position, in an area away from the center of the aggregate base substrate 12. This has posed the problem that the light distribution characteristics as designed cannot be obtained when the center of the LED element 1 and the center of the transparent resin encapsulating body 3 are thus disposed offset from each other. Specifically, for example, even when the LED element 1 is optically designed such that light emitted from the LED element 1 focuses to a focal point as indicated by the arrows in FIG. 23A, the light emitted from the LED element 1 deviates from the intended light distribution without focusing to the focal point as indicated by the arrows in FIG. 23B.

Such variations in light distribution are thought to be caused by factors such as the difference in dimensional change at the time of heating during molding and cooling after heating that results from the difference between the coefficients of linear expansion of the base material of the overmolding mold and the substrate material of the aggregate base substrate 12, variation in positional alignment when the aggregate base substrate is set in the mold, and the difference in pitch accuracy between the LED element on the aggregate base substrate and the lens portion of the lens molding mold. Thus, when this aggregate base substrate having the hemispherical transparent resin encapsulating body formed thereon is cut along the cut line, the relative positions of the cut line and the LED element are fixed, whereas the transparent resin encapsulating body may be disposed offset from the center of the space enclosed by the cut line. This has posed the problem that the light distribution varies among the separated LED devices.

Such deviation in light distribution has little influence in the case of such applications as a general lighting device. However, in the case of applications requiring highly accurate light distribution characteristics, LED devices are produced that do not sufficiently satisfy the required characteristics.

As an example of the technique for improving the arrangement accuracy of a lens with respect to an LED element, Laid-Open Patent Publication No. JP2003-008065 below discloses a technique by which the LED element is encapsulated with a flat transparent resin encapsulating body, and thereafter the lens is aligned and then bonded using a separate body, thus accurately aligning the positions of the center of the LED element and the center of the lens.

It is an object of the present invention to provide a lens-equipped optical semiconductor device whose light distribution is controlled with high accuracy, and a method for efficiently producing a lens-equipped optical semiconductor device that has little variation in light distribution.

SUMMARY OF THE INVENTION

According to one aspect of the present invention, there is provided a lens-equipped optical semiconductor device including: an optical semiconductor device including an optical semiconductor element (also referred to as "optical semiconductor chip") mounted on a substrate and a transparent resin encapsulating body that encapsulates the optical semiconductor element; a resin lens having a recessed portion for housing the transparent resin encapsulating body; and a transparent resin layer filled into a space among the substrate, the recessed portion, and the transparent resin encapsulating body, wherein the recessed portion has a capacity that is at least 1.1 times a total volume of the optical semiconductor element and the transparent resin encapsulating body. With this configuration, the capacity of the recessed portion is sufficiently larger than the total volume of the optical semiconductor element and the transparent resin encapsulating body. Accordingly, it is possible to correct the positional offset of the transparent resin encapsulating body with respect to the position of the optical semiconductor element. Therefore, it is possible to obtain a lens-equipped optical semiconductor device whose light distribution is controlled with high accuracy.

According to another aspect of the present invention, there is provided a method for producing a lens-equipped optical semiconductor device, including the steps of: preparing an optical semiconductor device including at least one optical semiconductor element mounted on a substrate and a transparent resin encapsulating body that encapsulates the optical semiconductor element; supplying an uncured transparent resin to a recessed portion of a resin lens, the recessed portion being provided for housing the transparent resin encapsulating body of the optical semiconductor device; placing the transparent resin encapsulating body into the recessed portion in which the uncured transparent resin has been supplied, and bringing the uncured transparent resin and the transparent resin encapsulating body into close contact with each other such that the resin lens is disposed at a predetermined position; and forming a transparent resin layer by curing the uncured transparent resin, wherein the recessed portion has a capacity that is at least 1.1 times a total volume of the optical semiconductor element and the transparent resin encapsulating body. With this production method, any offset between the position of the transparent resin encapsulating body formed on the optical semiconductor device and the center of the optical semiconductor element can be corrected with the transparent resin encapsulating body, the transparent resin layer, and the resin lens. Therefore, it is possible to obtain a lens-equipped optical semiconductor device whose light distribution is controlled with high accuracy.

Objects, features, aspects, and advantages of the present invention will become more apparent from the following detailed description and the accompanying drawings.

According to the present invention, any offset of the position of the transparent resin encapsulating body with respect to the position of the optical semiconductor element can be corrected with the transparent resin layer and the resin lens. Accordingly, it is possible to obtain a lens-equipped optical semiconductor device whose light distribution is controlled with high accuracy.

DETAILED DESCRIPTION OF THE PREFERRED EMBODIMENTS

Figure 1:
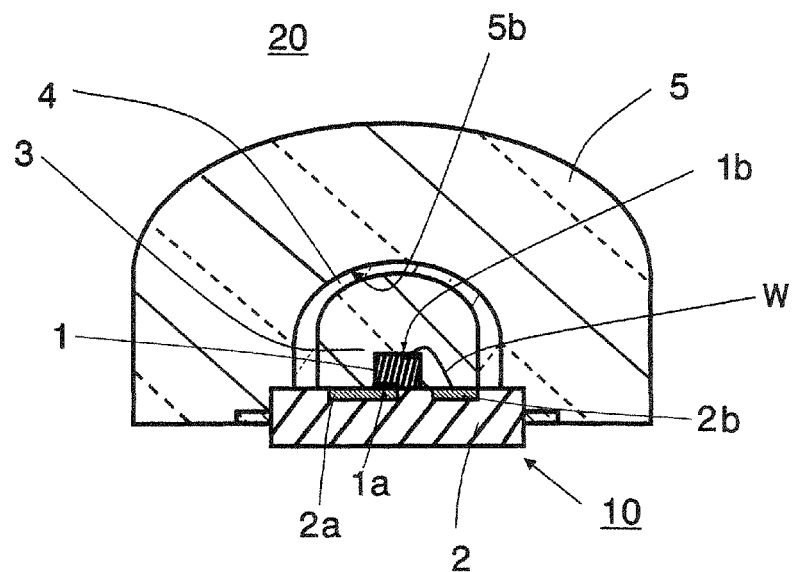
FIG. 1 is a schematic cross-sectional view of a lens-equipped LED device 20 according to the present embodiment.

FIG. 1 is a schematic cross-sectional view of a lens-equipped LED device 20, which is one embodiment of a lens-equipped optical semiconductor device according to the present invention. The lens-equipped LED device 20 includes an LED device 10, a resin lens 5, and a transparent resin layer 4. The LED device 10 includes a submount substrate 2, an LED element 1 mounted on the submount substrate 2, and a hemispherical transparent resin encapsulating body 3 that encapsulates the LED element 1. The resin lens 5 includes a recessed portion 5b for housing the transparent resin encapsulating body 3. The transparent resin layer 4 is a transparent resin that has been filled into a space formed between the outer wall of the transparent resin encapsulating body 3 and the inner walls of the submount substrate 2 and the recessed portion 5b. The submount substrate 2 includes, on its bottom face, lead terminals (not shown), which are a pair of electrodes. In the present embodiment, an example in which the LED element 1 is used as the optical semiconductor element will be representatively described. Any other optical semiconductor element such as a photoelectric conversion element used for solar cells and an optical element used for laser emitting semiconductors may be used in place of the LED element 1. Also, as the LED element 1, any conventionally known LED element that emits ultraviolet light, near-ultraviolet light, visible light exhibiting wavelengths in a range from blue to red, radiation in the wavelength range of near-infrared light, and infrared light may be used without any particular limitation. Additionally, a phosphor layer for converting the wavelength of light emitted from the LED element 1 may be provided on the surface of the LED element 1.

In the LED device 10, the electrode 1a provided on the bottom face of the LED element 1 is die-bonded to the circuit electrode 2a formed on the submount substrate 2. Also, the electrode 1b provided on the upper face of the LED element 1 is wire-bonded to the circuit electrode 2b on the submount substrate 21 using a gold wire w. Thus, the LED element 1 is mounted on the submount substrate 2. Although the LED element 1 is wire-bonded to the submount substrate in the present embodiment, the LED element 1 may be mounted by a flip chip mounting method. Then, the mounted LED element 1 is encapsulated with the hemispherically molded transparent resin encapsulating body 3. Although the LED device 10 is obtained by encapsulating only a single LED element 1, an LED device obtained by covering a plurality of LED elements 1 with a single transparent resin encapsulating body may be alternatively used.

An example of the method for producing the lens-equipped LED device 20 will be described in detail with reference to the drawings.

Figure 2:
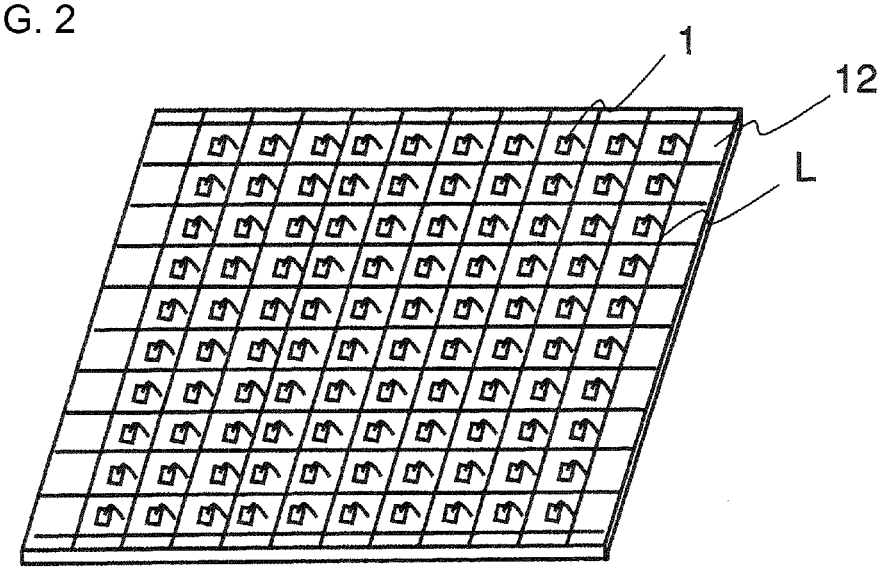
FIG. 2 is a schematic diagram illustrating a state in which a plurality of LED elements 1 are mounted on the surface of an aggregate base substrate 12.

In the production method according to the present embodiment, first, a plurality of LED elements 1 are mounted onto a single aggregate base substrate 12 as shown in FIG. 2. A grid-like cut line L defining cutting lines is formed in advance in the aggregate base substrate 12, and an LED element 1 is mounted at a predetermined position at the center of each square of the grid. Note that the circuit electrodes 2a and 2b for mounting the LED element 1 are formed on the aggregate base substrate 12 in advance.

There is no particular limitation with respect to the type of the aggregate base substrate 12, and it is possible to use, for example, a ceramic substrate such as an aluminum nitride substrate, a resin substrate, a metal substrate with an insulating layer formed on the surface thereof, or a substrate obtained by forming, on the surface of any of these substrates, a light-reflecting functional layer obtained by filling a silicone resin with titanium oxide.

Note that in the industrial production of the LED devices, the interval between adjacent LED elements of the aggregate base substrate is narrowed in order to increase the number of the LED devices formed by multi-cavity molding. When a large number of LED elements, for example, 100 or more LED elements are mounted, the interval between the LED elements is significantly small relative to the size of a single aggregate base substrate from the viewpoint of productivity; for example, a large number of LED elements are disposed with a narrow pitch such as a 1 mm interval. Because the interval between adjacent LED elements on the aggregate base substrate is thus small, it has been difficult to provide a transparent resin encapsulating body in the form of a large lens that significantly changes the directional characteristics or a transparent resin encapsulating body in the form of a lens that is optically designed with high accuracy for industrial production. With the production method according to the present embodiment, the resin lenses can be separately retrofitted to the transparent resin encapsulating bodies in a process subsequent to the production of LED devices efficiently formed by multi-cavity molding. Accordingly, a large lens or a lens that is optically designed with high accuracy can be provided to the LED device.

Next, each of the LED elements 1 mounted on the aggregate base substrate 12 is encapsulated with the transparent resin, thus forming a plurality of transparent resin encapsulating bodies 3. The transparent resin encapsulating body 3 may be formed, for example, by overmolding. This process will be described with reference to FIGS. 3.

Figure 3A:
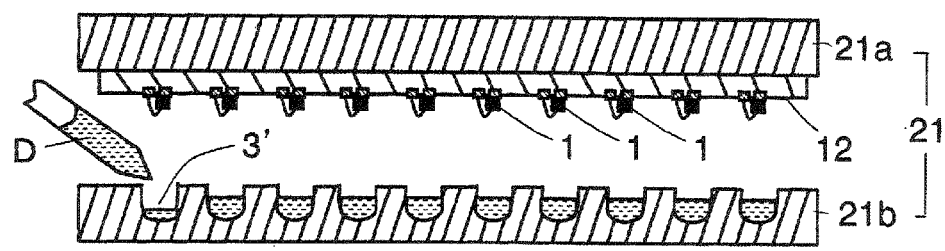
FIGS. 3 are schematic process cross-sectional views sequentially illustrating processes of overmolding the transparent resin encapsulating body.
Figure 3B:
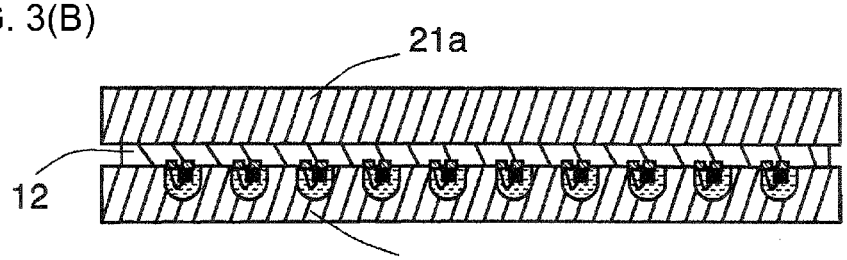
Figure 3C:
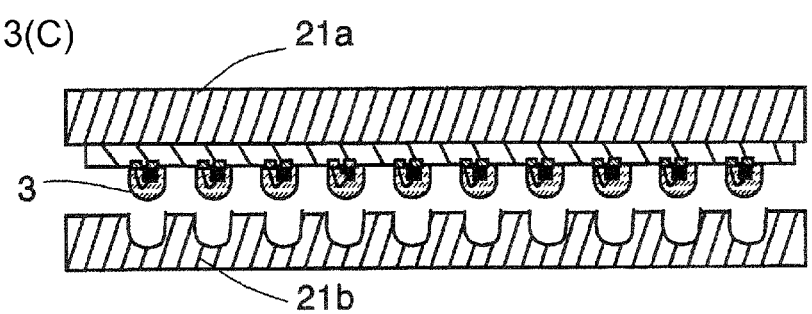
Figure 3D:
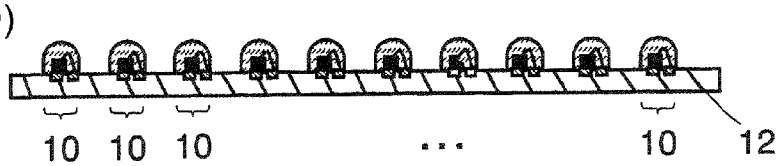

In this process, first, as shown in FIG. 3(a), the aggregate base substrate 12 on which the LED elements 1 have been mounted is fixed to the upper mold 21*a* of the overmolding mold 21. Meanwhile, an uncured transparent resin 3' for forming the transparent resin encapsulating bodies 3 is injected into the cavities of the lower mold 21*b* using the dispenser D. Note that in order to improve the mold releasability of the resulting molded body and omit washing of the mold, a detachable mold-releasing film may be brought into close contact with the lower mold 21*b* in advance. An example of the method for performing molding with the mold-releasing film in close contact is as follows. First, the mold-releasing film is placed on the lower mold 21*b*, and the mold-releasing film is brought into close with the cavities by vacuum suction from a vacuum line (not shown) provided at the bottom portion of the cavities. Then, the uncured transparent resin 3' is supplied to the cavities using the dispenser D, and molding is carried out. Then, after molding, the aggregate base substrate 12 is removed from the mold together with the mold-releasing film.

Any transparent resin having excellent light transmission can be used as the uncured transparent resin without any particular limitation. Specifically, it is possible to use, for example, a silicone gel, a silicone elastomer, a silicone rubber, a hard silicone resin, a silicone-modified epoxy resin, an epoxy resin, a silicone-modified acrylic resin, an acrylic resin, and the like. Of these, it is preferable to use an elastic resin such as a silicone elastomer having a JIS A hardness (also called "JIS A Shore hardness") after curing of 70 or less, and more preferably 10 to 60, or a silicone gel having a penetration of 20 to 100, measured using a penetrometer equipped with a ¼ scale cone under a total load of 9.38 g in accordance with JIS K 2220, because they have excellent light transmission and thus reduce stress caused by heat shock and the like, thus suppressing delamination, and they can provide a lens having excellent deformation resistance and discoloration resistance during high-temperature reflow mounting using a lead-free solder.

Examples of commercially available silicone elastomers include various grades of LED silicone elastomers, specifically, JCR6101UP, OE-6351, a silicone gel OE-6250, and a silicone adhesive SE9187L, all manufactured by Dow Corning Toray Co., Ltd., and a silicone adhesive with a reduced low molecular weight siloxane such as "KE4895" manufactured by Shin-Etsu Chemical Co., Ltd.

Where necessary, the uncured transparent resin 3' may contain components such as a phosphor for converting the emission color through conversion of the wavelength of the light emitted from the LED element 1, or a light-diffusing agent for diffusing light, as long as the effects of the present invention will not be impaired. Further, the transparent resin encapsulating body 3 may include, on the inside or the surface thereof, a phosphor layer, a color filter layer, a light diffusion layer, and so forth.

Specific examples of the phosphor include (Ca, Sr, Ba)5 (PO4)3Cl:Eu2+, ZnS:Ag, CaS:Bi, and the like whose emission color is blue, BaMg2Al16O27:Eu2+, Mn2+, ZnS:Cu, Al, Au, SrAl2O4:Eu2+, Zn2Si (Ge) O4:Eu2+, and the like whose emission color is green, Y2O2S:Eu3+, 3.5 MgO·0.5 MgF2·GeO2:Mn, LiEuW2O8, BaO·Gd2O3·Ta2O5:Mn, and K5Eu2.5(WO4)6.25, whose emission color is red, and phosphors such as a YAG-based phosphor, a TAG-based phosphor, an orthosilicate alkaline earth-based phosphor, an alpha-sialon phosphor, a CASN (CaAlSiN3) -based phosphor, a beta-sialon phosphor, and a Lanthanum oxynitride-based phosphor. Further, specific examples of the light-diffusing agent include inorganic fillers such a glass powder, calcium carbonate, titanium oxide, lead oxide, silica, barium sulfate, and alumina.

It is also possible to achieve the diffusing effect by blending a phenyl-based silicone adhesive and a dimethyl-based silicone adhesive that have different refractive indices to emulsify them, or to achieve the diffusing effect by using an acrylic resin powder or a silicone rubber powder.

Although the shape of the transparent resin encapsulating body 3 formed by overmolding is preferably hemispherical in order to realize high light extraction efficiency, the shape is not limited thereto and may be, for example, a transparent resin encapsulating body whose upper face is flat.

Next, as shown in FIG. 3(*b*), the upper mold 21*a* to which the aggregated base substrate 12 is fixed and the lower mold 21*b* with the transparent resin 3' housed in the cavities are closed and held in this state for a predetermined time to cure the transparent resin 3, thus forming the transparent resin encapsulating body 3. Note that the mold 21 is set at a mold temperature suitable for the curing temperature of the uncured transparent resin 3'. Further, in order to prevent any void from remaining inside the transparent resin encapsulating body 3, it is preferable to perform a degassing operation on the uncured transparent resin 3' before the mold is closed.

Then, as shown in FIG. 3 (*c*), the upper mold 21*a* and the lower mold 21*b* are opened. Then, as shown in FIG. 3 (*d*), a plurality of LED devices 10 formed inside the aggregated base substrate 12 are obtained.

Figure 4:
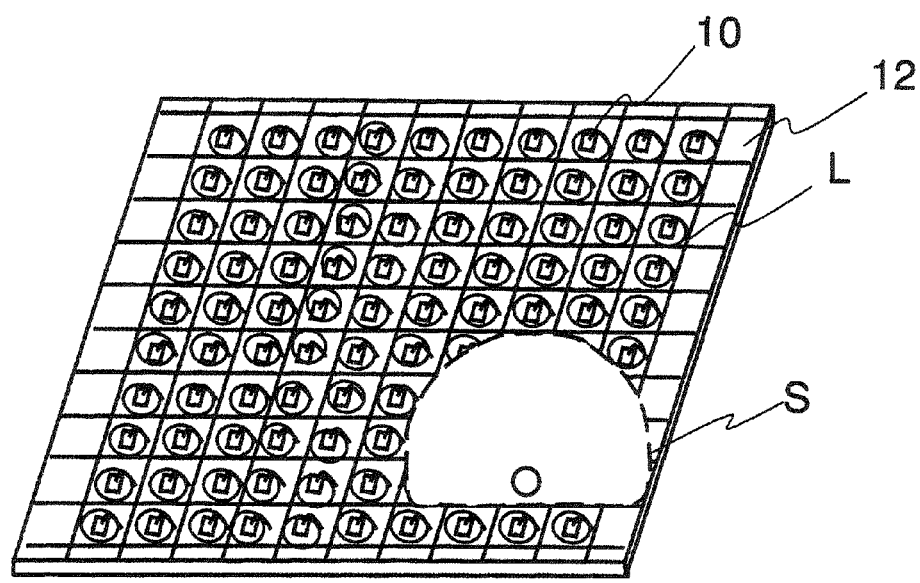
FIG. 4 is an explanatory diagram illustrating a process of cutting the aggregate base substrate 12 including a large number of LED devices 10 using a dicing saw S so as to separate the LED devices 10.
Figure 5A:
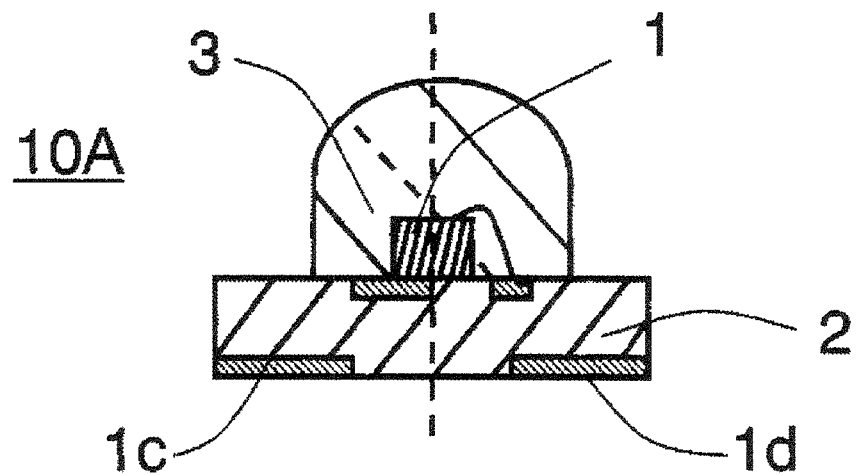
FIG. 5A is a schematic cross-sectional view illustrating a state in which the transparent resin encapsulating body 3 is disposed as designed, with respect to an LED element 1.
Figure 5B:
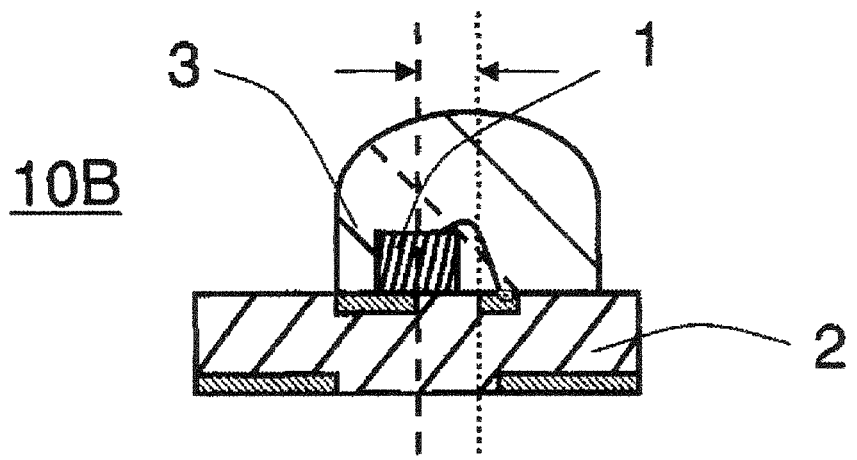
FIG. 5B is a schematic cross-sectional view illustrating a state in which the transparent resin encapsulating body 3 is disposed offset from the designed position, with respect to an LED element 1.

Next, the plurality of LED devices 10 formed inside the aggregated base substrate 12 are separated by performing cutting along the cut line L formed in the aggregated base substrate 12. Specifically, as shown in FIG. 4, the aggregated base substrate 12 is cut along the sharp groove-like cut line L using the dicing saw S, for example. Note that there is no particular limitation with respect to the cut line L as long as it is a mark that allows cutting while maintaining a precise distance from the LED element 1, such as V-shaped cuts being formed on edge portions of the aggregated base substrate to simply show the starting position and the terminating position of the dicing saw S. By performing cutting in this manner, for example, an LED device 10A shown in FIG. 5A or an LED device 10B as shown in FIG. 5B is obtained. The LED device 10A in FIG. 5A is an LED device in which the center of the LED element 1 and the center of the transparent resin encapsulating body 3 precisely coincide. The LED device 10B in FIG. 5B is an LED device in which the center of the LED element 1 and the center of the transparent resin encapsulating body 3 are offset from each other.

Note that there is a tendency for the LED element 1 disposed on the submount substrate 2 to be disposed substantially at the designed position, and for only the transparent resin encapsulating body 3 to be offset from the designed position. The reason for this is that because the LED element 1 is mounted at the precise position as designed relative to the cut line L before overmolding, the LED element 1 is disposed at the designed position of the submount substrate 2 when cutting is performed along the cut line L. Specifically, for example, when the LED element 1 is designed so as to be located at the central portion of the submount substrate 2, the LED element 1 is disposed precisely at that central portion. Accordingly, by cutting the aggregated base substrate 12 along the cut line, the LED element 1 is disposed at the designed position of the submount substrate 2.

FIG. 5A is a schematic cross-sectional view of an LED device 10A in which the center of the LED element 1 and the center of the transparent resin encapsulating body 3 coincide. FIG. 5B is a schematic cross-sectional view of an LED device 10B in which the center of the LED element 1 and the center of the transparent resin encapsulating body 3 are offset from each other. As described above, when a plurality of LED devices 10 are produced at one time by multi-cavity molding, the positions of the transparent resin encapsulating bodies 3 formed on the LED devices 10 may vary. This may result in many products being obtained in which the center of the LED element 1 and the center of the transparent resin encapsulating body 3 deviate from the design values. Such deviation can be corrected by the following process.

Figure 6A:
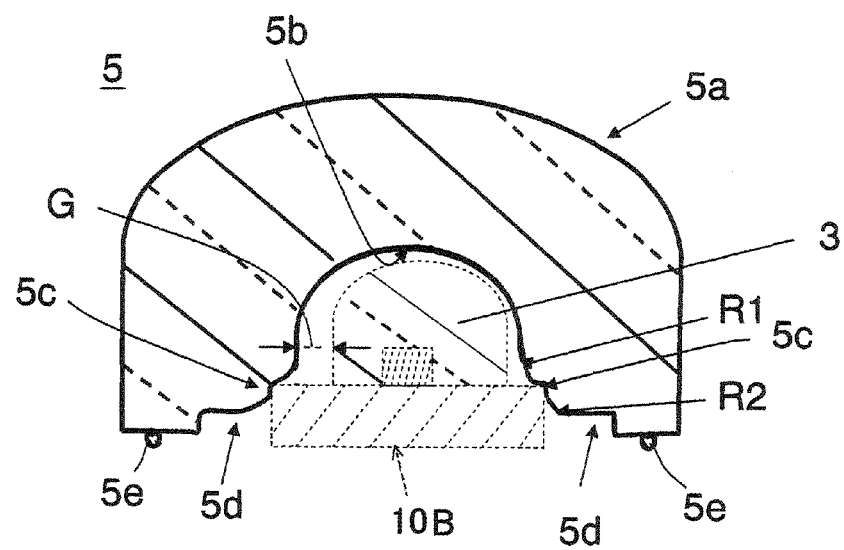
FIG. 6A is a schematic cross-sectional view of a resin lens 5.
Figure 6B:
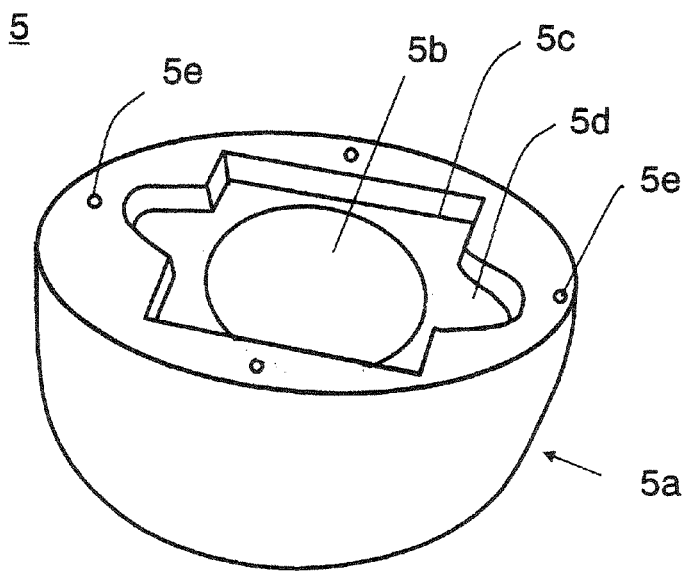
FIG. 6B is a schematic perspective view of the resin lens 5 in FIG. 6A as viewed from the bottom.

FIG. 6A is a schematic cross-sectional view of a resin lens 5 used in the present embodiment. FIG. 6B is a schematic perspective view of the resin lens 5, as viewed from the bottom. Note that in FIG. 6A, the position of the LED device 10B that is to be disposed is indicated by the dashed line. The resin lens 5 includes a lens portion 5a and a recessed portion 5b for housing the transparent resin encapsulating body 3 of the LED device. The lens portion 5a has a lens shape that is optically designed according to the application. Specifically, a shape is selected so as to change the optical path along which incident light is transmitted and exits, so that light is collected, diffused, refracted, reflected or the like, according to the application. Specific examples of such a lens shape include a convex lens, a concave lens, a cylindrical lens, a Fresnel lens, and a batwing lens. For an asymmetrically shaped lens such as a batwing lens, the alignment according to the present embodiment has particularly prominent effect in correcting the light distribution characteristics.

Any transparent resin having excellent light transmission may be used as the material of the resin lens 5 without any particular limitation. Specifically, the material is selected from the same resins as those used for producing the transparent resin encapsulating body 3. Of these, it is preferable to use a silicone elastomer, in particular, a silicone elastomer having a JIS A hardness when cured of 60 to 95, and more preferably 70 to 80, because surface tackiness is suppressed, light transmission is excellent, stress caused by heat shock or the like is reduced to suppress delamination, and deformation resistance and discoloration resistance during high-temperature reflow mounting using a lead-free solder are excellent. Where necessary, the resin lens 5 may contain a phosphor for converting the emission color through conversion of the wavelength of the light emitted from the LED element 1, a light-diffusing agent for diffusing light, and the like as long as the effects of the present invention will not be impaired.

Although there is no particular limitation with respect to the shape of the recessed portion 5b of the resin lens 5, a shape conforming to the outer shape of the transparent resin encapsulating body 3 is preferable because it enables the light distribution to be controlled more precisely. For example, when the outer shape of the transparent resin encapsulating body 3 is hemispherical, it is preferable that the top face portion of the recessed portion 5b has a similar hemispherical surface as well.

The capacity of the recessed portion 5b is at least 1.1 times, preferably 1.15 to 4 times, and more preferably 1.2 to 2 times the total volume of the LED element 1 and the transparent resin encapsulating body 3. When the capacity of the recessed portion 5b is less than 1.1 times the total volume of the LED element 1 and the transparent resin encapsulating body 3, the clearance is decreased when the transparent resin encapsulating body 3 is housed. Accordingly, when the positional offset of the transparent resin encapsulating body 3 with respect to the LED element 1 is too large, it is not possible to secure a clearance for sufficiently correcting the positional offset. When the scaling factor of the capacity of the recessed portion 5b with respect to the volume of the transparent resin encapsulating body 3 is too large, the filling efficiency of the transparent resin tends to be reduced, which results in a reduced light extraction efficiency. Also, delamination tends to occur between the transparent resin layer 4 and the recessed portion 5b of the resin lens 5.

As shown in FIG. 6A, it is preferable that a horizontal distance G from the inner wall of the recessed portion 5b to the outer wall of the transparent resin encapsulating body 3 is 50 µm or more on average, and more preferably 200 µm or more on average, in terms of securing a high degree of freedom of correction of positional offset.

It is preferable that the resin lens 5 has a mark for disposing the submount substrate 2 at a predetermined position, and a shape for guiding and fixing the substrate to a precise position. Specifically, for example, it is preferable that a fitting portion 5c to which the submount substrate 2 is fitted, a projection or a pin-shaped portion that is inserted into a hole provided in advance in the submount substrate 2, and the like are provided around the recessed portion. In this case, the resin lens and the LED element can be aligned easily. Also, a mark for performing positional alignment using a camera may be provided.

Furthermore, as will be described in detail below, it is preferable that the resin lens 5 includes an overflow resin reservoir 5d for receiving transparent resin that overflows in order to prevent air from remaining in the uncured transparent resin when the uncured transparent resin and the transparent resin encapsulating body are brought into close contact with each other. It is also preferable to perform surface modification such as plasma treatment, corona treatment, frame treatment, ITRO treatment, or UV treatment on the surface of the transparent resin encapsulating body 3 and the surface of the recessed portion 5b of the resin lens 5. Such surface modification can improve the surface wettability, thus preventing air inclusion and also improving adhesiveness. Further, it is preferable that the resin lenses 5 have small projections or a satin-like finish on the lens surface in order to prevent the resin lenses from adhering to each other owing to the surface tackiness. In particular, when the resin lenses 5 easily adhere to each other, it is preferable that the resin lenses 5 have projections 5e or a satin-like finish surface on flat portions or the like where the resin lenses 5 easily adhere to each other, as shown in FIG. 6A or 6B.

Such a resin lens 5 is formed, for example, by cast molding, compression molding, injection molding, or the like.

Figure 7A:
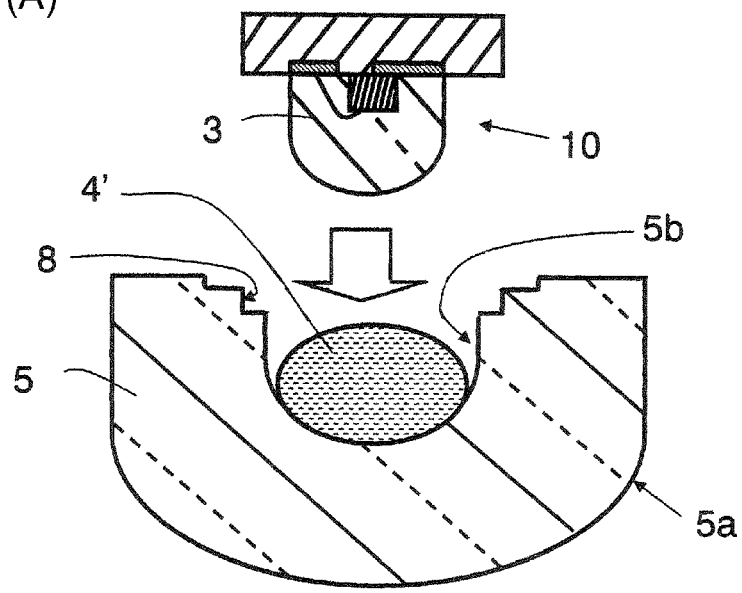
FIG. 7A is a schematic cross-sectional view illustrating a state before an LED device 10 is placed into a recessed portion 5b of the lens 5 in which an uncured transparent resin 4' has been supplied.
Figure 7B:
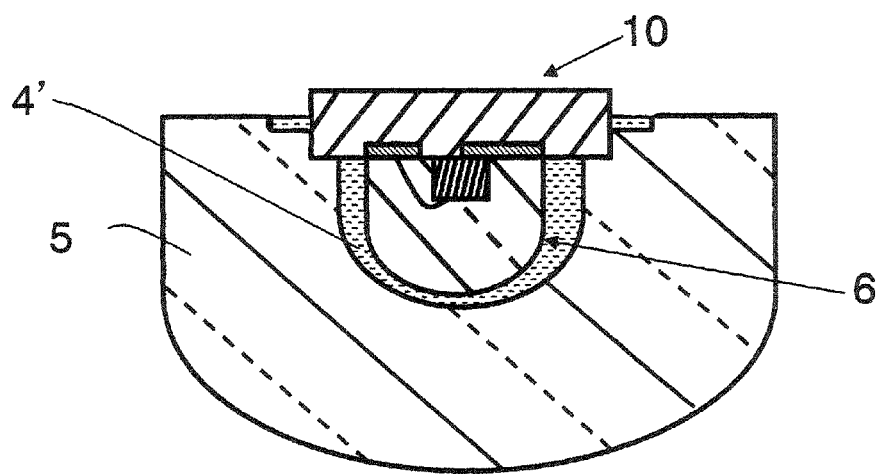
FIG. 7B is a schematic cross-sectional view illustrating a state after an LED device 10 has been placed into the recessed portion 5b of the lens 5 in which the uncured transparent resin 4' had been supplied.

In this process, the uncured transparent resin 4' is supplied to the recessed portion 5b formed on the resin lens 5 as shown in FIG. 7A, and thereafter, the transparent resin encapsulating body 3 of the LED device 10 is placed into the recessed portion 5b as shown in FIG. 7B.

Any resin that forms a transparent resin having excellent light transmission can be used as the uncured transparent resin 4' without any particular limitation. Specifically, the uncured transparent resin is selected from the same resins as those used for producing the transparent resin encapsulating body 3. Of these, it is preferable to use a silicone elastomer, in particular, a silicone elastomer having a JIS A hardness when cured of 10 to 80, and more preferably 20 to 50. Alternatively, it is preferable to use a silicone gel having a penetration of 20 to 100, measured using a penetrometer equipped with a ¼ scale cone under a total load of 9.38 g in accordance with JIS K 2220. Where necessary, the uncured transparent resin 4' may contain components such as a phosphor for converting the emission color through conversion of the wavelength of the light emitted from the LED element 1, or a light-diffusing agent for diffusing light, as long as the effect of the present invention will not be impaired.

Note that bubbles may remain at the interface between the transparent resin encapsulating body 3 and the uncured transparent resin 4' when the transparent resin encapsulating body 3 of the LED device 10 is placed into the recessed portion 5b and brought into close contact with the uncured transparent resin 4' after the uncured transparent resin 4' is supplied to the recessed portion 5b. If such bubbles remain at the interface after curing, they cause a void and may disturb the light distribution, which may generate noise light. Therefore, it is preferable that the viscosity of the uncured transparent resin 4' is as low as possible in order to suppress residual bubbles. Specifically, it is preferable that the viscosity of the uncured transparent resin 4' is 80 Pa·s or less, when measured by adhesive viscosity measurement at 25° C. using a single-cylinder rotational viscometer in accordance with JIS K 6833. It is more preferable to use a low viscosity of 1 to 30 Pa·s at 25° C. because it enables bubbles to be easily released.

In order to prevent bubbles from remaining, it is preferable that the uncured transparent resin 4' is supplied to the recessed portion 5b in such an amount that it overflows to the outside of the recessed portion 5b when the transparent resin encapsulating body 3 is housed in the recessed portion 5b. Specifically, it is preferable that the uncured transparent resin 4' is supplied in a volume that is about 1.1 to 1.5 times, and more preferably 2 to 3 times the volume of a space 6 formed by the inner wall of the recessed portion 5b, the submount substrate 2, and the transparent resin encapsulating body 3 (the volume of the space 6 in which the transparent resin layer is formed). When the amount of the uncured transparent resin 4' is too small, air cannot be sufficiently discharged from the recessed portion 5b, and thus a void tends to remain in the vicinity of the interface after curing. On the other hand, when the amount of the uncured transparent resin 4' is too large, too much uncured transparent resin 4' overflows, and productivity tends to decrease. Note that it is preferable to take the amount of overflow into consideration in advance, and provide an overflow resin reservoir 5d for housing any resin that overflows around the recessed portion 5b as shown in FIGS. 6A and 6B. Additionally, it is preferable that the resin reservoir 5d is provided at a position where it is as far away as possible from the lead terminals (not shown) formed on the bottom face of the submount substrate 2. In this case, it is possible to prevent the uncured transparent resin from climbing up to the lead terminals. As shown in FIG. 6A, it is preferable to form a taper R1 in the vicinity of the end of the recessed portion 5b in order to facilitate air release. As shown in FIG. 6A, it is preferable to form a taper R2 on the side of the resin reservoir 5d that is closer to the recessed portion 5b for the purpose of preventing the overflowed resin from covering the lead terminals formed on the bottom face of the submount substrate 2. The angle of such tapers R1 and R2 is preferably but is not particularly limited to about 45 degrees±30 degrees.

Figure 8:
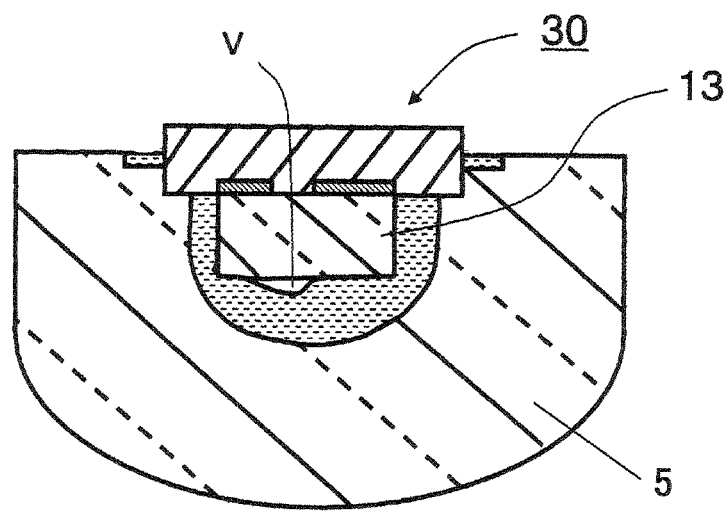
FIG. 8 is a schematic cross-sectional view of a lens-equipped LED device 40 in which the lens 5 is mounted onto an LED device 30 including a transparent resin encapsulating body whose a upper face is flat.
Figure 9:
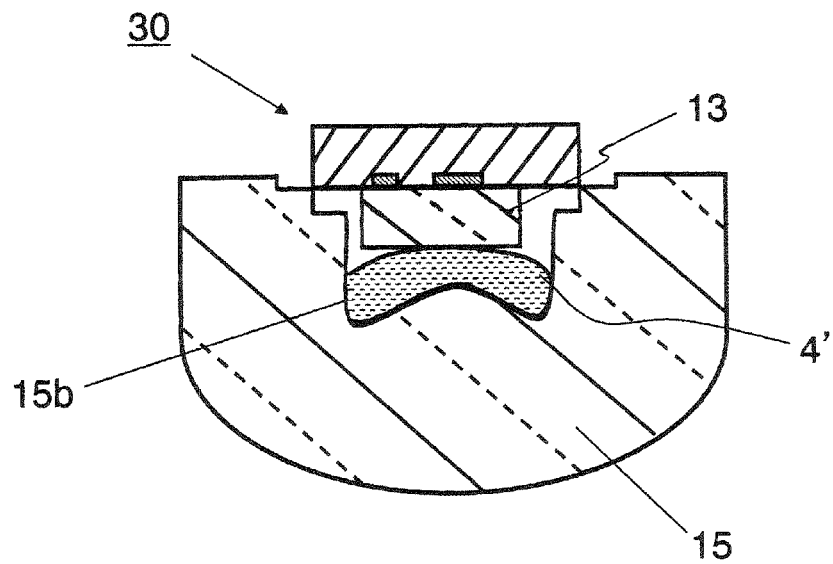
FIG. 9 is a schematic cross-sectional view illustrating a resin lens 15 having a recessed portion 15b having a raised central portion.
Figure 10:
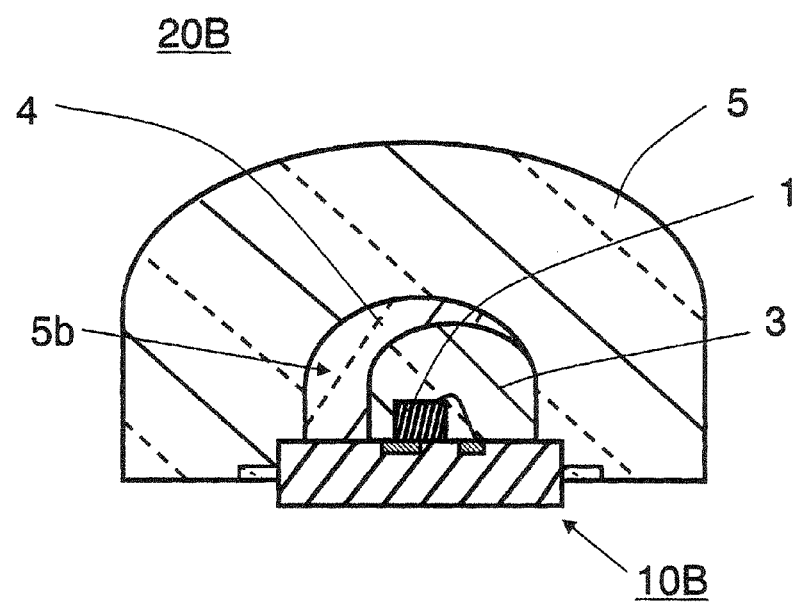
FIG. 10 is a schematic cross-sectional view of a lens-equipped LED device 20B in which the positional offset of the transparent resin encapsulating body 3 has been corrected with the transparent resin layer 4.

As shown in FIG. 8, bubbles v tend to remain especially when an LED device 30 including a transparent resin encapsulating body 13 whose upper face is flat is used. When the LED device 10 including the hemispherical transparent resin encapsulating body 3 as shown in FIG. 7A or 7B is used, air can be easily discharged because the uncured transparent resin 4' gradually increases the contact area starting from the top of the hemisphere of the transparent resin encapsulating body 3. Accordingly, bubbles tend not to remain. On the other hand, when the LED device 30 including the transparent resin encapsulating body 13 whose upper face is flat as shown in FIG. 8 is used, the uncured transparent resin 4' and the transparent resin encapsulating body 13 instantaneously come into contact with a wide contact area and thus the bubbles v tend to remain. In this case, it is preferable to use a resin lens 15 having a recessed portion 15b whose central portion is hemispherically raised as shown in FIG. 9. In this case, after the uncured transparent resin 4' is dispensed into the recessed portion 15b of the resin lens 15, the uncured transparent resin and the transparent resin encapsulating body gradually comes into contact at the time of placing the transparent resin encapsulating body 13 into the recessed portion 15b, thus making it possible to prevent air inclusion.

As shown in FIG. 7B, the transparent resin layer 4 is formed by placing the transparent resin encapsulating body 3 of the LED device 10 into the recessed portion 5b in which the uncured transparent resin 4' has been supplied and bringing the resin lens 5 and the submount substrate 2 into close contact with each other, followed by curing the uncured transparent resin 4'. Then, the LED device 10 and the resin lens 5 are integrated. At this time, it is preferable that the submount substrate 2 and the resin lens are joined by being bonded via the uncured transparent resin 4'. Note that in this case as well, partial delamination may inevitably occur. In such a case, as described above, it is preferable to suppress the occurrence of delamination as much as possible by adjusting the hardness of the resins that form the transparent resin encapsulating body and the resin lens. Thus, the lens-equipped LED device 20, which is a lens-equipped optical semiconductor device according to the present embodiment as shown in FIG. 1, is obtained.

Figure 11A:
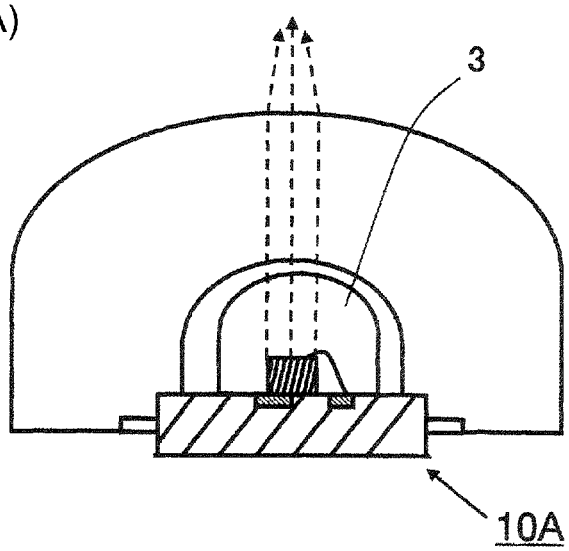
FIG. 11A is an explanatory diagram illustrating a light distribution obtained when an LED device 10A without any offset of the transparent resin encapsulating body 3 is used.
Figure 11B:
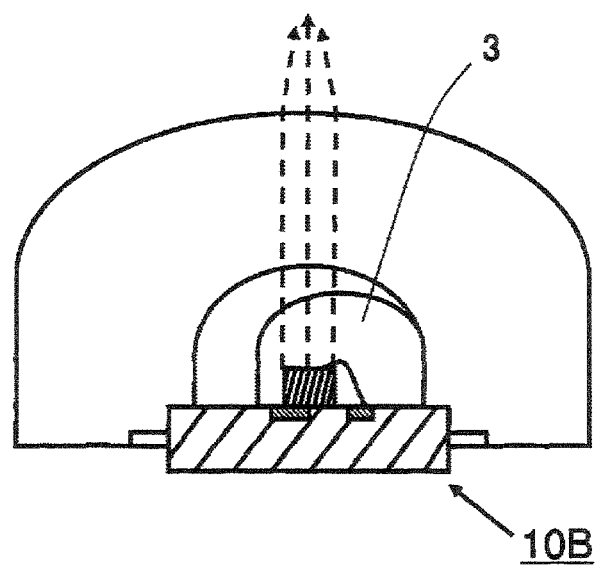
FIG. 11B is an explanatory diagram illustrating a light distribution of a lens-equipped LED device for which the light distribution of the LED device 10B having an offset of the transparent resin encapsulating body 3 has been corrected.

With the lens-equipped LED device according to the present embodiment, even when the LED device 10B in which the position of the transparent resin encapsulating body 3 is significantly offset as shown in FIG. 5B, it is possible to correct the light distribution so as to achieve the same light distribution as that achieved when the LED device 10A in which the transparent resin encapsulating body 3 is formed at the designed position as shown in FIG. 5A is used. That is, for example, when the fitting portion 5c that fits the outer shape of the submount substrate 2 is formed around the recessed portion 5b of the resin lens 5, and the position of the resin lens 5 with respect to the LED element 1 is aligned as designed, even if the position of the transparent resin encapsulating body 3 with respect to the LED element 1 is significantly offset, the light emitted from the LED element 1 can be controlled so as to have the designed light distribution by covering them with the resin lens 5. Then, for example, the light distribution obtained when the LED device 10B as shown in FIG. 11B is used can be corrected so as to be the same light distribution as that obtained when the LED device 10A as shown in FIG. 1A is used. Therefore, with the lens-equipped LED device according to the present embodiment, it is possible to correct deviation from the design values of the LED device.

Note that with the lens-equipped LED device according to the present embodiment, the transparent resin that forms the transparent resin encapsulating body (hereinafter also simply referred to as "first transparent resin"), the transparent resin that forms the transparent resin layer (hereinafter also simply referred to as "second transparent resin"), and the transparent resin that forms the resin lens (hereinafter also simply referred to as "third transparent resin) are preferably selected according to the following criteria.

Regarding the refractive index, it is preferable that the refractive indices of the first transparent resin, the second transparent resin, and the third transparent resin are as close as possible to one another. Specifically, it is preferable to select transparent resins each have a refractive index in the range of 1.3 to 1.6, and more preferably 1.41 to 1.55, and have a difference in refractive index of 0.2 or less, and more preferably 0.1 or less. By selecting transparent resins having refractive indices that are close to one another, it is possible to control the light distribution more precisely.

Regarding the hardness, it is preferable that the hardness of the first transparent resin is a JIS A hardness of 70 or less, and more preferably 10 to 60, and that the hardness of the third transparent resin is a JIS A hardness of 60 to 95, and more preferably 70 to 80. When the hardness of the first transparent resin is too high, delamination tends to occur at the interface between the LED element and the transparent resin encapsulating body due to heat shock or the like as described above. However, when the hardness of the first transparent resin is too low, the surface tackiness of the transparent resin encapsulating body is too high, and in this state, the transparent resin encapsulating body may adhere to a mounter used when the LED device is mounted to the resin lens, making it difficult to perform stable mounting. Also, adherence of shavings and dust produced during dicing causes a reduction in yield. By selecting a transparent resin having a JIS A hardness of 60 to 95 as the third transparent resin, the surface tackiness is suppressed and thus the mountability to a printed circuit board and the like using the mounter is improved. Note that when the hardness of the third transparent resin is too high, delamination tends to occur at the interface between the transparent resin layer and the resin lens due to heat shock or the like.

It is preferable that a transparent resin having a hardness that is intermediate between the hardness of the first transparent resin and the hardness of the third transparent resin is selected as the hardness of the second transparent resin. Specifically, it is preferable to select a transparent resin having a JIS A hardness of 10 to 80, and more preferably about 20 to 50. Further, in view of stress relaxation, a silicone gel having a penetration of 20 to 100, measured using a penetrometer equipped with a ¼ scale cone under a total load of 9.38 g in accordance with JIS K 2220.

Figure 12:
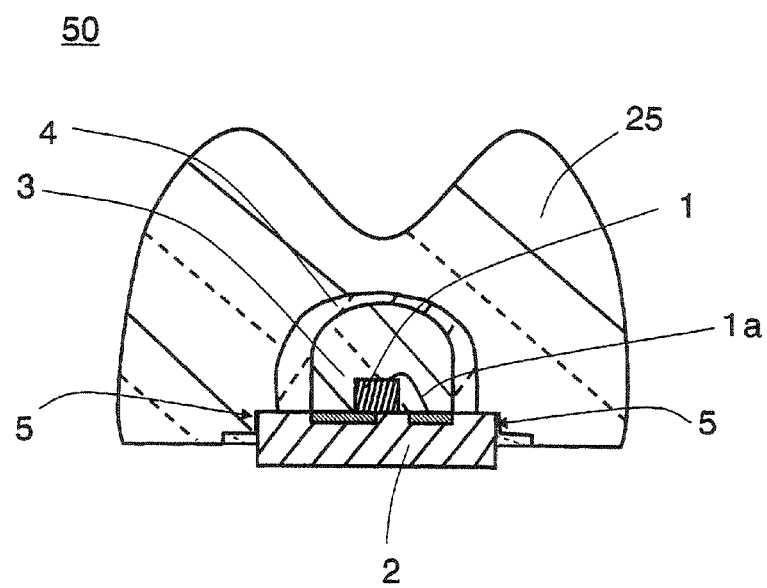
FIG. 12 is a schematic cross-sectional view of a lens-equipped LED device 50 including a batwing light distribution lens 25.

With the lens-equipped LED device according to the present embodiment, the offset from the designed position of the transparent resin encapsulating body with respect to the LED element can be corrected by providing the resin lens. Accordingly, it is possible to obtain a lens-equipped LED device whose light distribution is controlled with high accuracy. In particular, the light distribution correction effect is high especially for the lens-equipped LED device 50 and the like in which the lens needs to be formed with high precision, such as a resin lens 25, which is a batwing lens such as shown in FIG. 12.

As has been described in detail thus far, according to one aspect of the present invention, there is provided a lens-equipped optical semiconductor device including: an optical semiconductor device including at least one optical semiconductor element mounted on a substrate and a transparent resin encapsulating body that encapsulates the optical semiconductor element; a resin lens having a recessed portion for housing the transparent resin encapsulating body; and a transparent resin layer filled into a space among the substrate, the recessed portion, and the transparent resin encapsulating body, wherein the recessed portion has a capacity that is at least 1.1 times a total volume of the optical semiconductor element and the transparent resin encapsulating body.

In terms of securing a high degree of freedom of correction of positional offset, it is preferable that the horizontal distance from the inner wall of the recessed portion to the outer wall of the transparent resin encapsulating body is 50 μm or more on average.

Preferably, the transparent resin encapsulating body is a hemispherical encapsulating body that covers the optical semiconductor element on the surface of the substrate because of its excellent light extraction efficiency.

It is preferable that the transparent resin encapsulating body is a transparent resin molded body having a hardness of 70 or less, measured using an A-type hardness meter specified by JIS K 6253, and that the resin lens is a transparent resin molded body having a JIS A hardness of 60 to 95. By using such a transparent resin encapsulating body and a resin lens, it is possible to suppress the occurrence of delamination between the transparent resin encapsulating body and the transparent resin layer, and between the transparent resin layer and the resin lens. When the optical semiconductor device is repeatedly used and stopped, dimensional change caused by the heat generated during use and the repetition of cooling during stoppage of use may result in delamination at the interfaces, thus forming a gap. Such a gap may adversely affect the light distribution characteristics. Further, delamination may also occur between the optical semiconductor element and the transparent resin encapsulating body because of the difference between the coefficients of linear expansion of the optical semiconductor element and the transparent resin encapsulating body. In order to suppress delamination that occurs between the optical semiconductor element and the transparent resin encapsulating body, it is preferable to use an elastic resin having high stress relaxation, such as a silicone elastomer, as the resin that forms the transparent resin encapsulating body. By using such an elastic resin, the transparent resin encapsulating body follows the dimensional change of the optical semiconductor element even under repeated heat cycle testing, and thus delamination does not easily occur. Also, the delamination does not easily occur during reflow mounting at a high-temperature of 260° C. or higher using a lead-free solder. However, such an elastic resin having a low hardness has extremely high tackiness and a sticky surface. Thus, when an optical semiconductor device encapsulated with such an elastic resin is directly held with a mounting mounter, and is mounted to a printed circuit board or the like, the elastic resin sticks to a suction nozzle and the like of the mounter, resulting in the problem of not being able to perform the mounting smoothly. Furthermore, the optical semiconductor device encapsulated with such an elastic resin also has a problem in that dust and shavings from the aggregated base substrate adhere to the surface of the transparent resin encapsulating body, thus reducing the optical characteristics. Another problem is that the optical semiconductor device undergoes deformation by external force because of the softness of the encapsulating resin, leading to failures such as disconnection. In such a case, the problems as described above can be solved by protecting the transparent resin encapsulating body having high tackiness with the resin lens having a JIS A hardness of 60 to 95, which has low tackiness and a high hardness. Accordingly, it is possible to suppress the optical semiconductor device from adhering to the suction nozzle and the like of the mounter when the optical semiconductor device is mounted onto the printed circuit board, and also suppress dust or the like from adhering to the surface of the transparent resin encapsulating body. It is also possible to suppress disconnection or the like resulting from deformation of the encapsulating resin by external force. Furthermore, when the transparent resin encapsulating body has high tackiness, the transparent resin encapsulating body may adhere to the tape used during reel packing by taping. The ease of reel packing by taping is also improved by mounting the above-described resin lens. However, the surface of the resin lens may still have tackiness even if a transparent resin molded body having a JIS A hardness of 60 to 95 is used as the resin lens. This surface tackiness of the resin lens may cause the following production problem. That is, a plurality of resin lenses will tend to stick to each other during production because of their tackiness. In this case, for example, if resin lenses previously produced with a known part feeder are supplied when lens-equipped optical semiconductor devices are continuously assembled in an automated production process, there is a problem in that the flat surfaces of the resin lenses are bonded to each other because of their tackiness. A problem in such a case is that the process cannot proceed smoothly unless the bonded lenses are separated one by one during assembly. In such a case, provision of projections or a satin-like finish surface on the surface of the flat portion of each resin lens enables smooth continuous production to also be performed in an automated production process.

It is preferable that the resin lens has a shape for positioning the submount substrate with respect to the resin lens because this facilitates positioning between the resin lens and the optical semiconductor device. Specific examples include a resin lens including a fitting portion having an inner shape corresponding to the outer shape of the submount substrate, and projections or corners that allow positioning of the submount substrate. Such projections and corners may also function as projections for preventing the lenses from sticking to each other.

Further, it is preferable that the resin lens is a batwing lens because the effect of correcting the light distribution characteristics is significantly increased.

According to another aspect of the present invention, there is provided a method for producing a lens-equipped optical semiconductor device, including the steps of: preparing an optical semiconductor device including at least one optical semiconductor element mounted on a substrate and a transparent resin encapsulating body that encapsulates the optical semiconductor element; supplying an uncured transparent resin to a recessed portion of a resin lens, the recessed portion being provided for housing the transparent resin encapsulating body of the optical semiconductor device; placing the transparent resin encapsulating body into the recessed portion in which the uncured transparent resin has been supplied, and bringing the uncured transparent resin and the transparent resin encapsulating body into close contact with each other such that the resin lens is disposed at a predetermined position; and forming a transparent resin layer by curing the uncured transparent resin, wherein the recessed portion has a capacity that is at least 1.1 times a total volume of the optical semiconductor element and the transparent resin encapsulating body. With this production method, any offset between the optical axis of the transparent resin encapsulating body formed on the optical semiconductor device and the center of the optical semiconductor element can be corrected with the transparent resin encapsulating body, the transparent resin layer, and the resin lens. Therefore, it is possible to obtain a lens-equipped optical semiconductor device whose light distribution characteristics are controlled with high accuracy.

It is preferable that the resin lens has a mark or shape for arranging the optical semiconductor device at a predetermined position around the recessed portion, including specifically, for example, a shape having a corresponding inner shape to which the outer shape of the submount substrate is fitted, because the positional alignment between the resin lens and the optical semiconductor device is facilitated.

It is also preferable that the transparent resin encapsulating body is a transparent resin molded body having a JIS A hardness of 70 or less, and that the resin lens is a transparent resin molded body having a JIS A hardness of 60 to 95, given that the resin lens does not easily adhere to the suction nozzle or the like of the mounter used during continuous production, that dust or the like does not easily adhere to the surface of the lens-equipped optical semiconductor device formed, and that delamination does not easily occur in the lens-equipped optical semiconductor device because the device will have rubber elasticity and thus enables stress relaxation.

It is also preferable that the central portion of the recessed portion of the resin lens is raised given that air can be effectively expelled when the uncured transparent resin filled into the recessed portion and the transparent resin encapsulating body are brought into close contact with each other, and therefore a transparent resin layer having few voids can be formed.

EXAMPLES

Hereinafter, the present invention will be described more specifically by way of examples. It should be appreciated that the scope of the present invention is by no means limited by the examples.

Example 1

Figure 13:
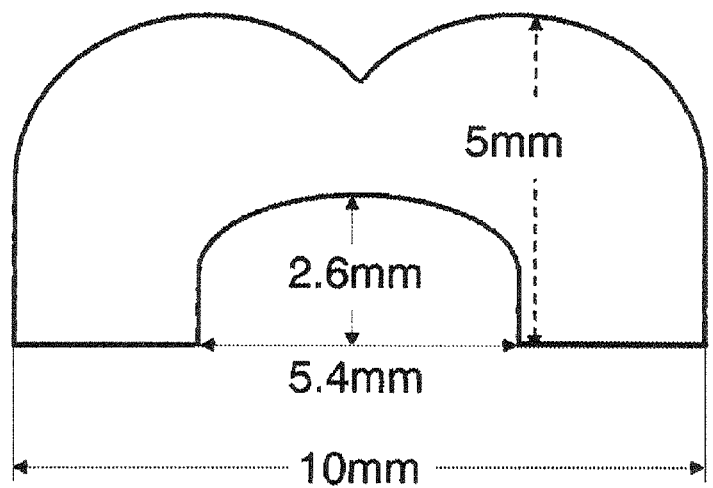
FIG. 13 is a schematic diagram showing the dimensions and shape of a silicone lens used in examples.

As an uncured silicone elastomer A1, OE-6636 (manufactured by Dow Corning Toray Co., Ltd.; JIS A hardness after curing of 90; refractive index of 1.54) was poured into a mold including a cavity, and heat-cured at 150° C., thus yielding a silicone lens X1, which is a batwing lens having a shape such as shown in FIG. 13. The silicone lens X1 includes a lens portion of a shape having a major axis of 10 mm and a height of 5 mm and including two hemispherical elevations, and the lens portion includes a recessed portion having a diameter of 5.4 mm, a height of 2.6 mm, and a capacity 0.04 $cm^3$ at the center of the rear face. Also, a slight degree of tackiness without adhesiveness was perceived on the surface of the silicone lens X1.

Then, as an uncured silicone elastomer B1, 0.02 cm3 of TSE3221S (manufactured by Momentive Performance Materials Japan LLC.; JIS A hardness after curing of 30; refractive index of 1.41) was filled into the recessed portion of the silicone lens X1 using a dispenser.

Figure 14:
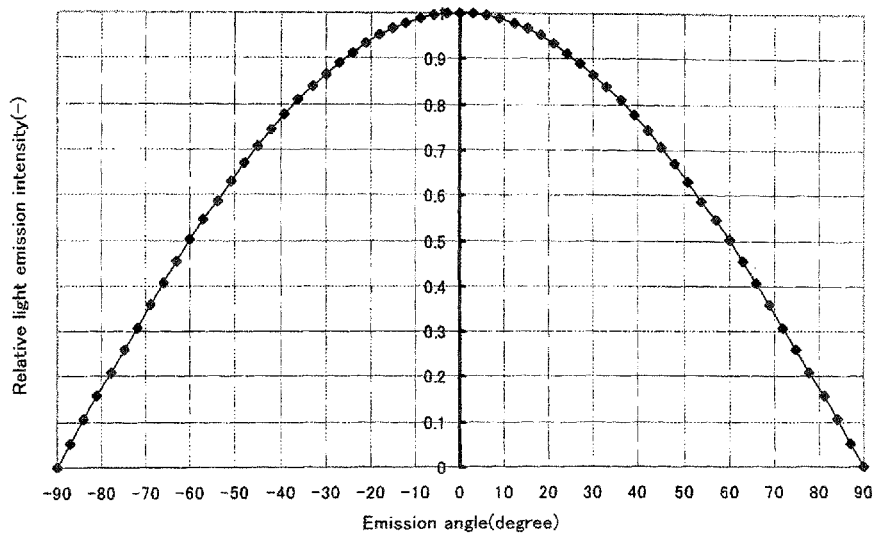
FIG. 14 is a graph in which the relative light emission intensity is plotted versus the emission angle, showing the light distribution characteristics of an overmolded LED device used in Example 1.

Next, a transparent resin encapsulating body of an overmolded LED device was placed into the recessed portion of the silicone lens X1 into which the uncured silicone elastomer B1 had been filled. Note that the overmolded LED device is an LED device in which an LED element that emits blue light was mounted at the center of a submount substrate, and the LED element was encapsulated by a hemispherical transparent resin encapsulating body formed of a silicone elastomer having a JIS A hardness of 40, containing a phosphor for converting blue light into white light, and having a diameter of 5.0 mm and a height of 2.5 mm, with the total volume of the LED element and the transparent resin encapsulating body being 0.032 cm3. Further, the center of the LED element and the center of the encapsulating body substantially coincided as designed. Note that FIG. 14 shows a graph in which the relative light emission intensity is plotted versus the emission angle, showing the light distribution characteristics of the above-described overmolded LED device.

Then, the submount substrate of the above-described overmolded LED device was positioned by being fitted to a fitting portion previously provided around the recessed portion of the silicone lens X1. The distance between the outer wall of the hemispherical encapsulating body and the inner wall of the recessed portion was 200 µm on average.

Thus, the encapsulating body of the overmolded LED device was brought into close contact with the uncured silicone elastomer B1. Then, the uncured silicone elastomer B1 was cured under the conditions of 150° C. for one hour, thus obtaining a lens-equipped LED device A in which the silicone lens X1 was bonded onto the surface of the transparent resin encapsulating body, and the submount substrate and the silicone lens X1 were bonded and fixed to each other via the silicone elastomer B1. Additionally, a transparent resin layer formed from a cured material of the silicone elastomer B1 and having an average thickness of 200 μm was formed between the recessed portion of the silicone lens X1 and the surface of the encapsulating body.

Figure 15:
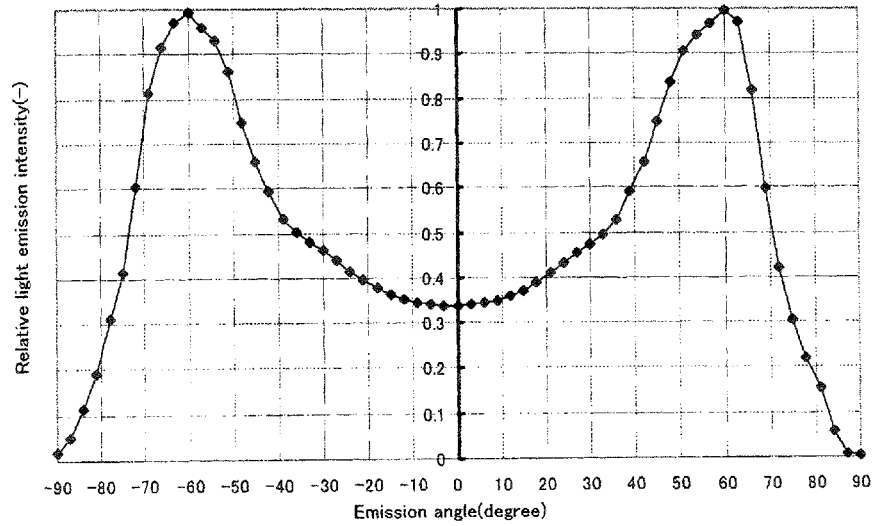
FIG. 15 is a graph in which the relative light emission intensity is plotted versus the emission angle of a lens-equipped LED device A obtained in Example 1.

FIG. 15 shows a graph in which the relative light emission intensity is plotted versus the emission angle of the obtained lens-equipped LED device A. As can be seen, the graph in FIG. 15 shows batwing-like light distribution characteristics having symmetrical peaks indicating uniform emission at orthogonal coordinates. Further, as a result of observation using a 10× magnifying glass, no void was found at the interface between the transparent resin layer and the transparent resin encapsulating body, or the bonding interface between the transparent resin layer and the silicone lens X1.

Further, as a result of performing thermal shock testing on 50 lens-equipped LED devices A produced in the same manner, neither cracking nor delamination occurred in any of the lens-equipped LED devices A. Note that the thermal shock testing was performed under the following conditions.

Thermal Shock Testing Conditions

Taking a reciprocal heating and cooling from 125° C. to −500° C. as one cycle, 100 cycles of thermal shock, each cycle lasting 30 minutes, were applied to 50 lens-equipped LED devices. Then, the 50 lens-equipped LED devices after being subjected to 100 cycles were observed using a stereoscopic microscope, and the number of the LED devices that had undergone cracking or delamination in the lens portion was calculated.

Example 2

Figure 16:
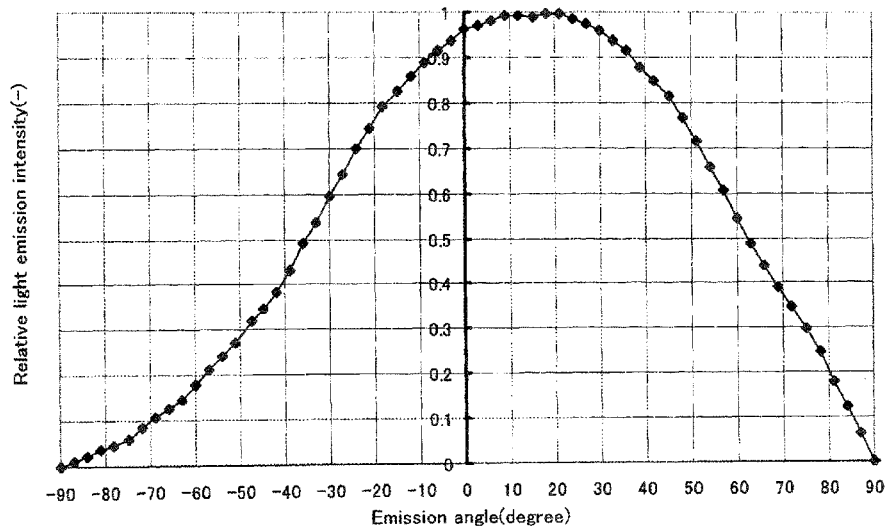
FIG. 16 is a graph in which the relative light emission intensity is plotted versus the emission angle, showing the light distribution characteristics of an overmolded LED device used in Example 2.
Figure 17:
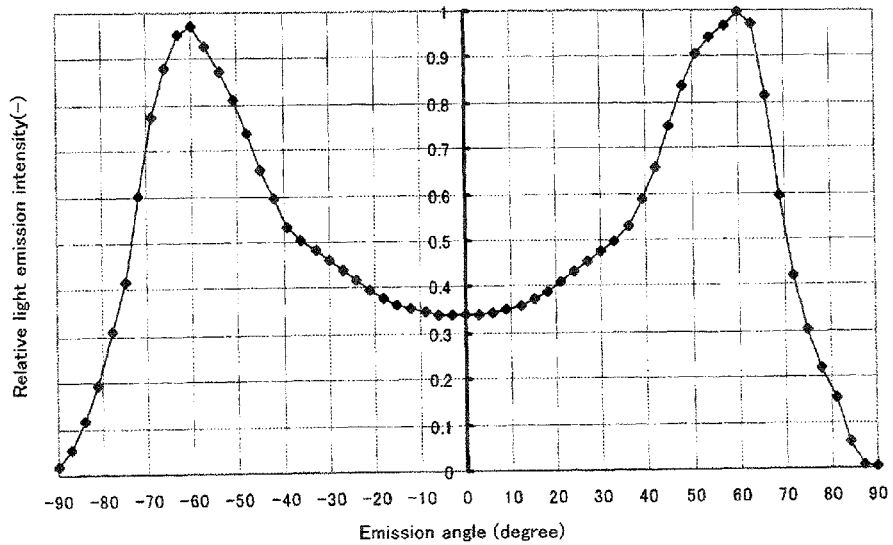
FIG. 17 is a graph in which the relative light emission intensity is plotted versus the emission angle of a lens-equipped LED device B obtained in Example 2.

A lens-equipped LED device B was obtained in the same manner as in Example 1 except that an overmolded LED device in which the center of the LED element and the center of the encapsulating body were offset by 100 μm was used as the overmolded LED device. FIG. 16 is a graph showing the light distribution characteristics of the above-described overmolded LED device, and FIG. 17 is a graph showing the light distribution characteristics of the obtained lens-equipped LED device B. As can be seen in the graph in FIG. 16, an asymmetrical peak indicating non-uniform emission at orthogonal coordinates was shown when the center of the LED element and the center of the encapsulating body were offset by 100 μm. However, as shown in the graph in FIG. 17, the lens-equipped LED device B including the silicone lens X1 showed batwing-like light distribution characteristics having symmetrical peaks indicating uniform emission at orthogonal coordinates, as in the case of the lens-equipped LED device A of Example 1. In this way, the light distribution characteristics were successfully corrected to those obtained when an offset-free overmolded LED device was used, even when an overmolded LED device in which the center of the LED element and the center of the encapsulating body were offset by 100 μm was used.

Example 3

A silicone lens X2 was formed in the same manner as in Example 1 except that an uncured hard silicone resin A2, SR7010 (manufactured by Dow Corning Toray Co., Ltd.; JIS D hardness after curing of 70; refractive index of 1.53) was used in place of the uncured silicone elastomer A1. Almost no tackiness was observed on the surface of the silicone lens X2.

A lens-equipped LED device C was obtained in the same manner as in Example 1 except that the silicone lens X2 was used in place of the silicone lens X1. As a result of examining the light distribution characteristics of the obtained lens-equipped LED device C, the LED device C had batwing-like light distribution characteristics having symmetrical peaks indicating uniform emission at orthogonal coordinates, as in Example 1. Further, only a few voids were found as a result of examining the interface between the transparent resin layer and the transparent resin encapsulating body, and the bonding interface between the transparent resin layer and the silicone lens X1 using a 10× magnifying glass.

However, thermal shock testing performed on 50 lens-equipped LED devices B produced in the same manner showed that cracking or delamination occurred in 30 lens-equipped LED devices. Even in this case, the light distribution characteristics were sufficiently corrected.

Comparative Example 1

Figure 18:
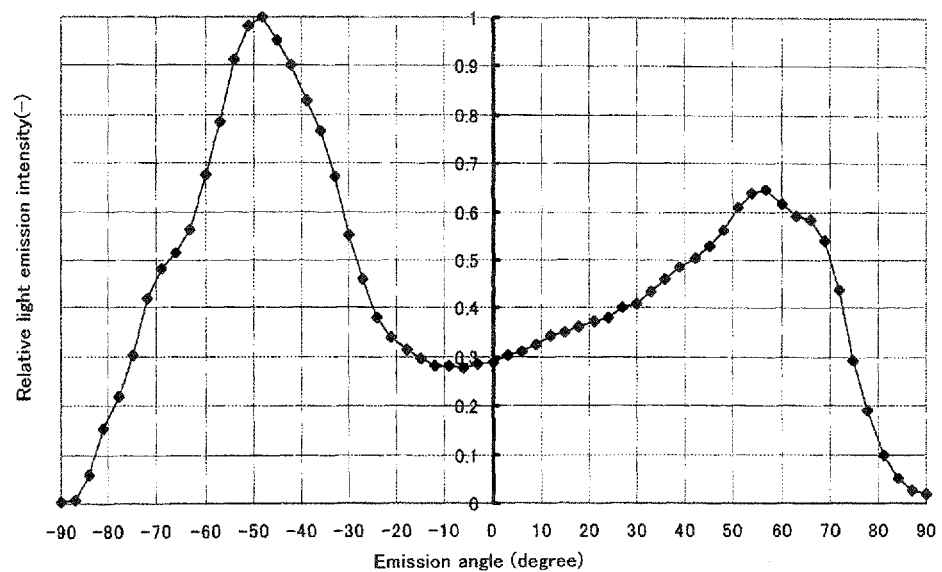
FIG. 18 is a graph in which the relative light emission intensity is plotted versus the emission angle of a lens-equipped LED device D obtained in a comparative example.
Figure 19:
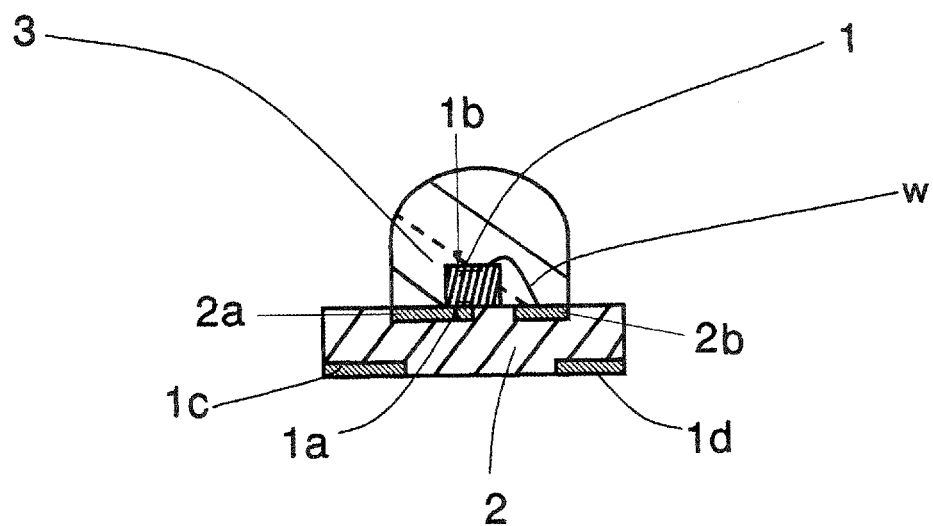
FIG. 19 is a schematic cross-sectional view of an LED device 110 including a hemispherical transparent resin encapsulating body 3.
Figure 20A:
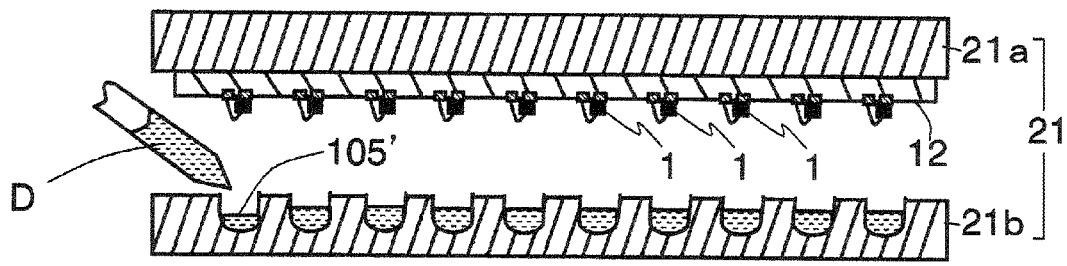
FIGS. 20 are schematic cross-sectional views illustrating overmolding of a transparent resin encapsulating body.
Figure 20B:
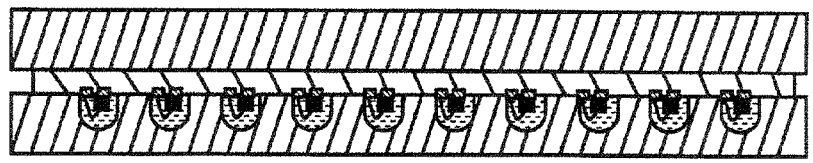
Figure 20C:
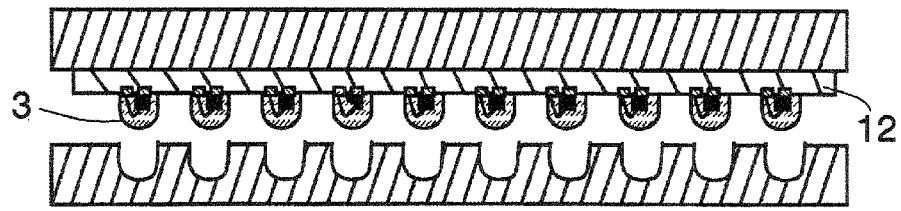
Figure 20D:
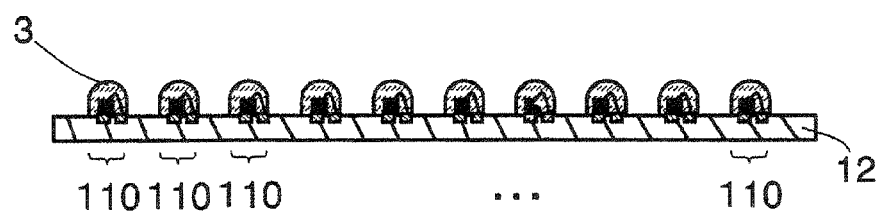
Figure 21:
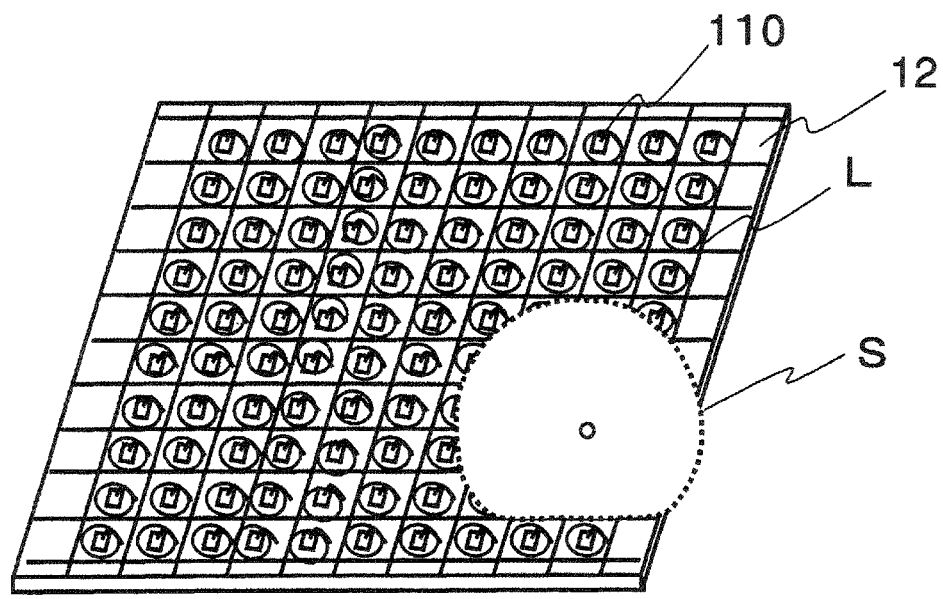
FIG. 21 is an explanatory diagram illustrating a process of cutting an aggregate base substrate 12 including a large number of LED devices 110 using a dicing saw S so as to separate the LED devices 110.
Figure 22:
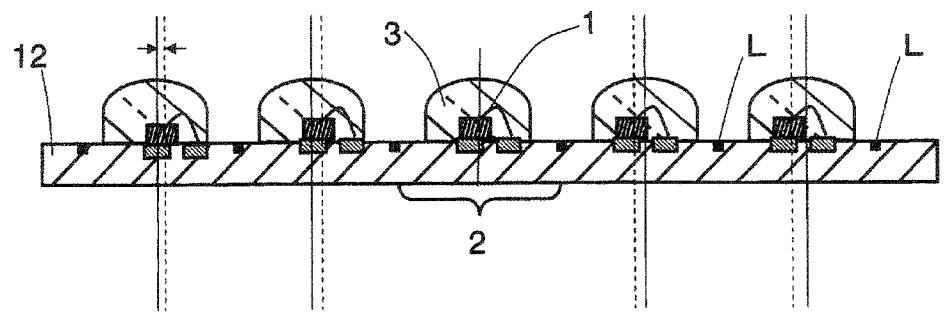
FIG. 22 is a schematic cross-sectional view illustrating the positional offset of the transparent resin encapsulating body 3 with respect to the LED element 1.
Figure 23A:
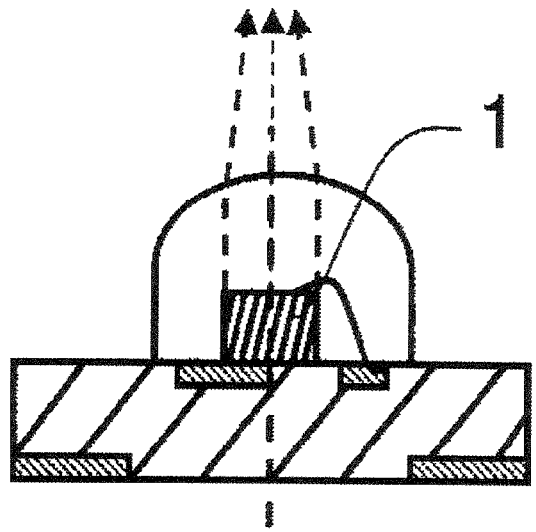
FIG. 23A is an explanatory diagram illustrating the light distribution of an LED device 110 in which the transparent resin encapsulating body 3 is disposed at a designed position.
Figure 23B:
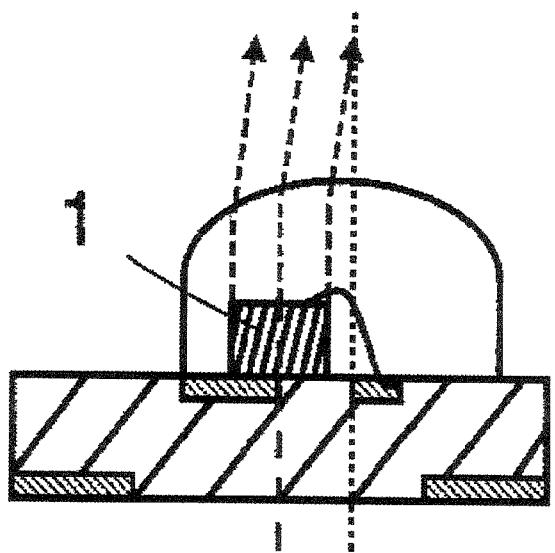
FIG. 23B is an explanatory diagram illustrating the light distribution of an LED device 110 in which the transparent resin encapsulating body 3 is disposed offset from the designed position.

A silicone lens X3 was formed in the same manner as in Example 1 except that a larger clearance was secured for the fitting portion by changing the dimensions of the recessed portion formed on the rear face of the silicone lens X1 to a diameter of 5.05 mm, 2.525 mm, a capacity of 0.034 cm3 so that they substantially match the outer shape of the transparent resin encapsulating body of the overmolded LED device. Note that the distance from the top face, which was the deepest part of the recessed portion, to the surface, which was the apex of the transparent resin encapsulating body, and the distance between the outer wall of the hemispherical encapsulating body and the inner wall of the recessed portion were 25 μm on average. Then, a silicone-based adhesive was supplied to the recessed portion of the silicone lens X3, and the transparent resin encapsulating body of the overmolded LED device used in Example 2, in which the center of the LED element and the center of the encapsulating body were offset by 100 μm, was fitted to the recessed portion of the silicone lens X3, thus integrating the transparent resin encapsulating body and the silicone lens X3. Then, the silicone-based adhesive was heat-cured under the conditions of 150° C. for one hour, and thereby the silicone lens X3 was bonded to the surface of the transparent resin encapsulating body. A lens-equipped LED device D was thus obtained. Additionally, a bonding layer formed from a cured material of the silicone-based adhesive and having an average thickness of 25 μm or less was formed between the surface of the recessed portion of the silicone lens X3 and the surface of the encapsulating body. FIG. 18 is a graph showing the light distribution characteristics of the obtained lens-equipped LED device D. The obtained lens-equipped LED device D had batwing-like light distribution characteristics having asymmetrical peaks indicating non-uniform emission at orthogonal coordinates.

The invention claimed is:

1. A lens-equipped optical semiconductor device comprising:
   an optical semiconductor device including at least one optical semiconductor element mounted on a substrate and a transparent resin encapsulating body that encapsulates the optical semiconductor element;
   a resin lens having a recessed portion for housing the transparent resin encapsulating body; and
   a transparent resin layer filled into a space among the substrate, the recessed portion, and the transparent resin encapsulating body,
   wherein the resin lens has a fitting shape around the recessed portion for guiding and fixing the substrate, and the recessed portion has a capacity that is at least 1.1 times a total volume of the optical semiconductor element and the transparent resin encapsulating body.

2. The lens-equipped optical semiconductor device according to claim 1, wherein a horizontal distance from an inner wall of the recessed portion to an outer wall of the transparent resin encapsulating body is 50 µm or more on average.

3. The lens-equipped optical semiconductor device according to claim 1, wherein the transparent resin encapsulating body is a hemispherical encapsulating body that covers the optical semiconductor element on a surface of the substrate.

4. The lens-equipped optical semiconductor device according to claim 1, wherein the transparent resin encapsulating body is a transparent resin molded body having a JIS K 6253 A hardness of 70 or less, and the resin lens is a transparent resin molded body having a JIS K 6253 A hardness of 60 to 95.

5. The lens-equipped optical semiconductor device according to claim 1, wherein the resin lens has a projection or a satin-like finish on a surface thereof.

6. The lens-equipped optical semiconductor device according to claim 1, wherein the resin lens is a batwing lens.

7. The lens-equipped optical semiconductor device according to claim 1, wherein the resin lens and the substrate are joined by the transparent resin layer.

8. A method for producing a lens-equipped optical semiconductor device, comprising the steps of:
preparing an optical semiconductor device including at least one optical semiconductor element mounted on a substrate and a transparent resin encapsulating body that encapsulates the optical semiconductor element;
supplying an uncured transparent resin to a recessed portion of a resin lens, the recessed portion being provided for housing the transparent resin encapsulating body of the optical semiconductor device;
placing the transparent resin encapsulating body into the recessed portion in which the uncured transparent resin has been supplied, and bringing the uncured transparent resin and the transparent resin encapsulating body into close contact with each other such that the resin lens is disposed at a predetermined position; and
forming a transparent resin layer by curing the uncured transparent resin,
wherein the resin lens has a fitting shape around the recessed portion for guiding and fixing the substrate, and
the recessed portion has a capacity that is at least 1.1 times a total volume of the optical semiconductor element and the transparent resin encapsulating body.

9. The method for producing a lens-equipped optical semiconductor device according to claim 8, wherein a horizontal distance from an inner wall of the recessed portion to an outer wall of the transparent resin encapsulating body is 50 µm or more on average.

10. The method for producing a lens-equipped optical semiconductor device according to claim 8, wherein the transparent resin encapsulating body is a transparent resin molded body having a JIS K 6253 A hardness of 70 or less, and the resin lens is a transparent resin molded body having a JIS K 6253 A hardness of 60 to 95.

11. The method for producing a lens-equipped optical semiconductor device according to claim 8, wherein a central portion of the recessed portion is raised.

12. The lens-equipped optical semiconductor device according to claim 1, wherein the fitting shape is concave and is dimensioned to receive a portion of the substrate therein.

* * * * *